(12) United States Patent
Shi

(10) Patent No.: US 11,316,324 B2
(45) Date of Patent: Apr. 26, 2022

(54) ARRAY OF SURFACE-EMITTING LASERS WITH HIGH-BRIGHTNESS UNIPOLAR OUTPUT

(71) Applicant: National Central University, Taoyuan (TW)

(72) Inventor: Jin-Wei Shi, Taoyuan (TW)

(73) Assignee: National Central University, Taoyuan (TW)

( * ) Notice: Subject to any disclaimer, the term of this patent is extended or adjusted under 35 U.S.C. 154(b) by 90 days.

(21) Appl. No.: 17/025,214

(22) Filed: Sep. 18, 2020

(65) Prior Publication Data

US 2021/0336423 A1 Oct. 28, 2021

Related U.S. Application Data

(60) Provisional application No. 63/016,328, filed on Apr. 28, 2020.

(51) Int. Cl.
*H01S 5/00* (2006.01)
*H01S 5/183* (2006.01)
*H01S 5/42* (2006.01)
*H01S 5/343* (2006.01)
(Continued)

(52) U.S. Cl.
CPC .......... *H01S 5/18355* (2013.01); *H01S 5/187* (2013.01); *H01S 5/3201* (2013.01); *H01S 5/34366* (2013.01); *H01S 5/42* (2013.01); *H01S 5/183* (2013.01); *H01S 5/34353* (2013.01); *H01S 5/423* (2013.01)

(58) Field of Classification Search
CPC ........ H01S 5/42; H01S 5/187; H01S 5/34366; H01S 5/423; H01S 5/183; H01S 5/18355; H01S 5/3201
See application file for complete search history.

(56) References Cited

U.S. PATENT DOCUMENTS 8,561,473 B2 * 10/2013 Blumenkranz ........ A61B 34/71
606/1
9,952,107 B2 * 4/2018 Blumenkranz ........ A61B 34/71
(Continued)

OTHER PUBLICATIONS

II-VI, 940nm Multi Mode High Power VCSEL Array, APS6401010001, 2020.
(Continued)

*Primary Examiner* — Kinam Park
(74) *Attorney, Agent, or Firm* — Demian K. Jackson; Jackson IPG PLLC

(57) ABSTRACT

An array of surface-emitting lasers is provided. The array outputs high brightness in a unipolar way. The array comprises a stress-adjustment unit and a plurality of epitaxial device units. The stress-adjustment unit is used to adjust stress. The stress from a substrate is used to select a laser mode for an aperture unit. The selection of the laser mode is enhanced for the aperture unit without sacrificing driving current. Low current operation is achieved in a single mode for effectively reducing volume and further minimizing the size of the whole array to achieve high-quality laser output. An object can be scanned by the outputted laser to obtain a clear image with a high resolution. Hence, the present invention is applicable for face recognition with high recognition and high security.

20 Claims, 9 Drawing Sheets

(51) Int. Cl.
    *H01S 5/187*   (2006.01)
    *H01S 5/32*    (2006.01)

(56) References Cited

U.S. PATENT DOCUMENTS

| | | | |
|---|---|---|---|
| 10,186,839 B1* | 1/2019 | Liu | H01S 5/1206 |
| 2010/0155952 A1* | 6/2010 | Koike | H01L 21/76867 |
| | | | 257/E23.161 |

OTHER PUBLICATIONS

Mial E. Warren et al., Low-divergence high-power VCSEL arrays for lidar application, Nov. 27, 2018.
Jin-Wei Shi et al, Hgh-Power and single-mode VCSEL arrays with single-polarized outputs by using package-induced tensile strain, vol. 45, No. 17, Sep. 1, 2020.

* cited by examiner

US 11,316,324 B2

ARRAY OF SURFACE-EMITTING LASERS WITH HIGH-BRIGHTNESS UNIPOLAR OUTPUT

TECHNICAL FIELD OF THE INVENTION

The present invention relates to an array of surface-emitting lasers; more particularly, to single-polarizing with stress adjustment provided by a stress-adjustment unit for enhancing the selection of laser mode of an aperture unit, where driving current is not sacrificed while achieving a single-mode and low-current operation for effectively reducing volume and further minimizing the size of the whole array.

DESCRIPTION OF THE RELATED ARTS

A prior art of an array of multimode high-power vertical-cavity surface-emitting lasers (VCSEL) has electro-optical parameters of 25 celsius degree (° C.), a 4.5 amperes (A) current, a 2-millisecond (ms) pulse length, and 6 percent (%) of direct current (DC) power cycles for a far-field emission curve, as shown in FIG. 8. As shown in the figure, the multimode of the prior art is not improved, so that the far-field diagram of the laser output has a big divergent angle as turned to obtain a multimode form having a donut-like shape. To solve this problem, another prior art of an array of low-divergence high-power VCSELs for laser-radar application has a structure shown in FIG. 9 as sectioned. The prior art adds a back lens in the structure to reduce its far-field divergence angle. However, its volume becomes large, so that the overall size of the device becomes large. Under the trend of high-density for surface-emitting laser array currently, the substantive requirement of small volume is not met. Hence, the prior arts do not fulfill all users' requests on actual use.

SUMMARY OF THE INVENTION

The main purpose of the present invention is to single-polarize with stress adjustment provided by a stress-adjustment unit for enhancing the selection of laser mode of an aperture unit, where driving current is not sacrificed while achieving a single-mode and low-current operation for effectively reducing volume and further minimizing the size of the whole array to output high-quality laser; an object can be scanned by the outputted laser to obtain a clear image having a high resolution; and, therefore, the present invention is applicable for face recognition achieving high recognition and high security.

To achieve the above purposes, the present invention is An array of surface-emitting lasers with high-brightness unipolar output, comprising a stress-adjustment unit and a plurality of epitaxial device units, where the stress-adjustment unit comprises a copper layer and an epitaxial layer stacked on the copper layer; the stress-adjustment unit obtains a stress adjustable to single-polarize the stress for enhancing selectivity of an aperture to a laser mode driving current is not sacrificed while obtaining a single-mode and low-current operation; each one of the epitaxial device units is stacked on the stress-adjustment unit and comprises a first distributed Bragg reflector (DBR); an active region stacked on the first DBR; and a second DBR stacked on the active region; the active region has a current-confining aperture; the current-confining aperture is deposed in a grouping above or beneath the active region; the current-confining aperture obtains a current confinement zone through oxidation or indentation at an annular lateral part of an aluminum (Al) composite layer; and the Al composite layer contains Al, a III element, more than 20%. where the second DBR contains a diffusion unit having a thickness reduced to 0.1~2 micrometers; the diffusion unit is located around an annular area on top of the second DBR with a multilayer of different compositions selectively disordered through a doping diffusion process to obtain a single layer of single composition; and the second DBR is thus enabled to control a sum number of optical modes. Accordingly, a novel array of surface-emitting lasers with high-brightness unipolar output is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

Figure 1:
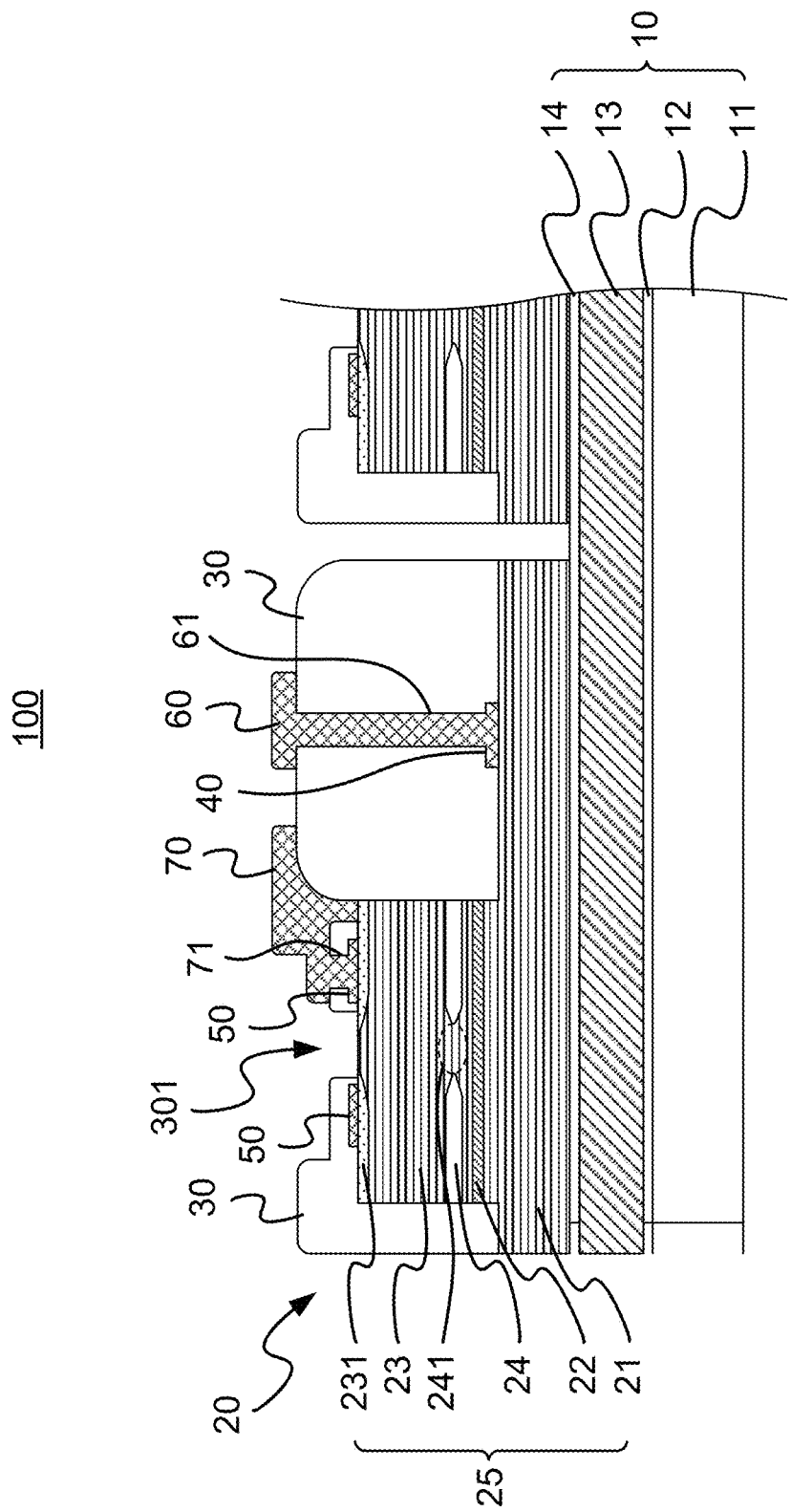
FIG. 1 is the view showing the preferred embodiment according to the present invention.

The following description of the preferred embodiment is provided to understand the features and the structures of the present invention.

Please refer to FIG. 1 to FIG. 7, which are a view showing a preferred embodiment according to the present invention; a structural view showing a first state-of-use; a structural view showing a second state-of-use; a structural view showing a third state-of-use; a view showing far-field patterns of laser outputs; a view showing spectral bands of single modes; and a view showing the traces of bias current vs. output power. As shown in the figures, the present invention is an array of surface-emitting lasers with high-brightness unipolar output 100, comprising a stress-adjustment unit and a plurality of epitaxial device units 20.

The stress adjustment structure 10 sequentially stacks the followings on a copper layer 11, including a gold layer 12, a substrate 13, and an epitaxial-layer 14. The substrate 13 is selected from a P-type, N-type, or semi-insulating semiconductor of gallium arsenide (GaAs).

The epitaxial device units 20 are stacked on the stress-adjustment unit 10. Each of the epitaxial device unit 20 comprises a first distributed Bragg reflector (DBR) 21, an active region 22 stacked on the first DBR 21, and a second DBR stacked on the active region 22. The active region 22 has a current-confining aperture 24. The current-confining aperture 24 is deposed in a grouping above or beneath the active region 22. The current-confining aperture 24 obtains a current confinement zone 241 through oxidation or indentation at an annular lateral part of an aluminum (Al) composite layer; and the Al composite layer contains Al, a III element, more than 20 percent (%). Therein, the second DBR 23 contains a diffusion unit 231 having a thickness reduced to 0.1~2 micrometers (μm); the diffusion unit 231 is located around an annular area on top of the second DBR 23 with a multilayer of different compositions selectively disordered through a doping diffusion process to obtain a single layer of single composition; and the second DBR is thus enabled to control a sum number of optical modes.

In a preferred embodiment, an epitaxial device unit 20 has a current-confining aperture 24, which is formed through an etching process along lateral wall at a position more than 100 nanometers (nm) above an active region 22; and a diffusion unit 231, which is forming above the active region 22 with a multilayer of different compositions around an annular area on top of a second DBR 23 selectively disordered to form a single layer of single composition through a doping diffusion process. The active region is a heterojunction of a compound semiconductor with an alloy thereof, such as a heterojunction of indium aluminum gallium arsenide/aluminum gallium arsenide (InAlGaAs/AlGaAs). The active region 22 is further a multiple-quantum-wells (MQWs) of three InAlGaAs/AlGaAs interposed between a first DBR 21 and the second DBR 23. Then, the epitaxial device unit 20 is grown to form a convex mesa unit 25 through chemical etching. The convex mesa unit 25 comprises a part of the first DBR 21, the active region 22, the second DBR 23, and the current-confining aperture 24. The current-confining aperture 24 is located above the active region 22 and is not in touch with the active region 22. Furthermore, the current-confining aperture 24 is grown by forming an Al composite layer at first; then, a part of the lateral side is oxidized to define a current confinement zone 241, which has a diameter smaller than 20 μm, at center of an annular lateral area; and the Al composite layer contains Al, a III element, more than 20%. Besides, the current-confining aperture 24 can be formed through oxidation at a distance more than 100 nm to the active region 22; and the second DBR 23 contains a diffusion unit 231 having a thickness reduced to 0.1~2 μm. The diffusion unit 231 is located around an annular area on top of the second DBR 23, where, through the doping diffusion process, the multilayer of different compositions is selectively disordered to form the single layer of single composition.

The first DBR 21 is an n-type DBR (n-DBR) and the second DBR 22 is a p-type DBR (p-DBR); or, the first DBR 21 is a p-DBR and the second DBR 22 is an n-DBR.

In a first state-of-use of the preferred embodiment, a part of the Al composite layer is converted into an oxide layer with center area remained unchanged. Through selectively etching the oxide layer by using an etchant, the current-confining aperture 24 and the current confinement zone 241 are formed.

The multilayer of different compositions at center area on top of the second DBR 23 contains the diffusion unit having a diameter of 5~20 μm; and the diffusion unit is selectively disordered through doping zinc (Zn), magnesium (Mg), or a II, IV, or VI element. Besides, the diffusion unit at the annular area on top of the second DBR 23 is located above the active region 22 and is not in touch with the active region 22, as shown in FIG. 1.

The epitaxial device unit 20 further comprises an insulating layer (Bisbenzocyclobutene, BCB) 30, an N contact 40, a P contact 50, an N metal pad 60, and a P metal pad 70.

The insulating layer 30, having an aperture unit emitting a light source, extends and surrounds the second DBR 23, the active region 22, and a part of the first DBR 21 from two ends of the aperture unit. Thus, the current-confining aperture 24 is located in an area defined by the extension of the two ends of the insulating layer 30 for aligning the center of the aperture unit 301 with the center of the current confinement zone 241, where the insulating layer is surrounded by the lateral side of the second DBR 23, the active region 22, and a part of the first DBR 21.

The N contact 40 is buried in the insulating layer 30 and is located on an interface of the insulating layer 30 and the first DBR 21. The P contact 50 is buried in the insulating layer 30 and is located on an interface of the insulating layer 30 and the second DBR 23. The N metal pad 60 is formed on the insulating layer 30; and the insulating layer 30 contains a through hole 61 within for electrically connecting to the N contact 40. The P metal pad 70 is formed on the insulating layer 30; and a through hole 71 in the insulating layer 30 is electrically connected to the P contact 50.

Figure 2:
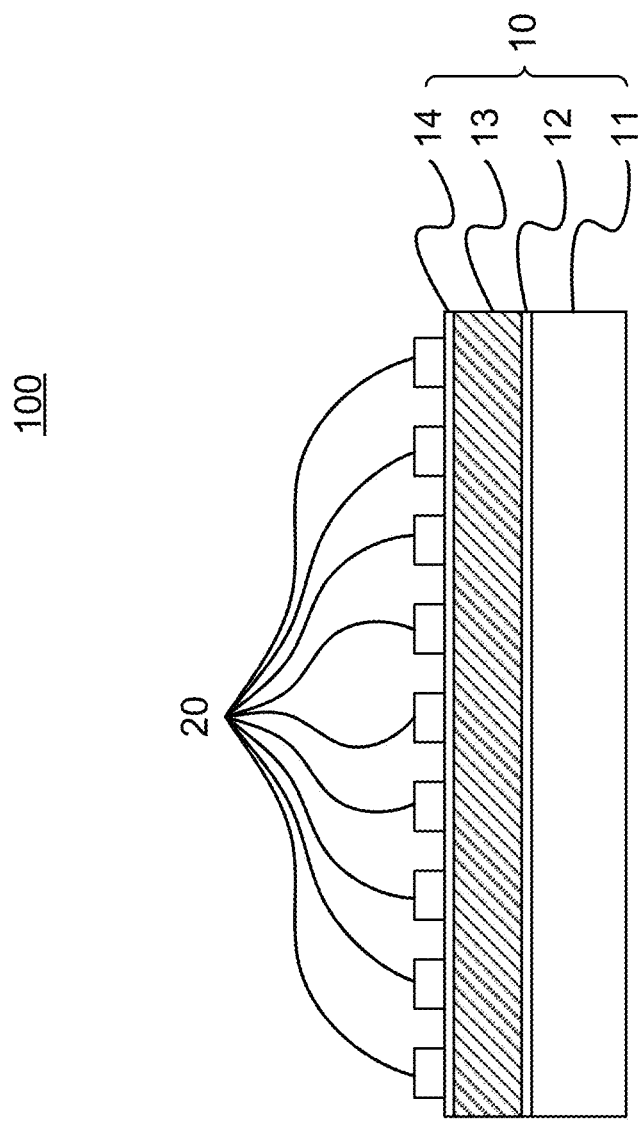
FIG. 2 is the structural view showing the first state-of-use.

On fabrication, an array of surface-emitting lasers with high-brightness unipolar output 100 is shown as the first state-of-use in FIG. 1 and FIG. 2. After a GaAs substrate 13 is thinned to 100~200 μm, a gold layer 12 is deposited on a surface thereof with a copper layer 11 further plated to obtain a thickness between 50 μm and 1 millimeter (mm); and an epitaxial layer 14 is set on the other surface of the GaAs substrate 13 to thus form a stress-adjustment unit 10. A plurality of epitaxial device units 20 are set on the epitaxial layer 14, where an Al composite layer is oxidized along a lateral side from each of the epitaxial device units 20 to form a current-confining aperture 24 above an active region 22; and, through a doping diffusion process, a multilayer of different compositions at center area on top of a second DBR 23 is selectively disordered to form a single layer of single composition for forming a low-reflectivity diffusion unit 231 having a thickness within 0.1 μm. Thus, the DBR is enabled to control a sum number of optical modes.

Nevertheless, the epitaxial device unit 20 is not limited to an aperture unit doped with Zn, other optical device works.

Figure 3:
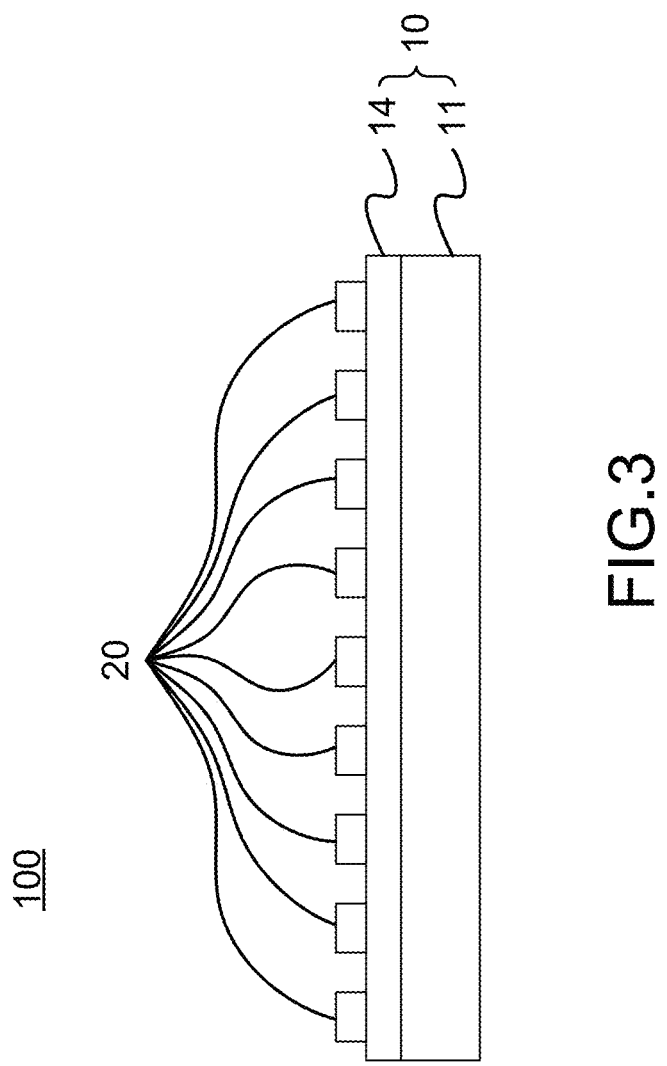
FIG. 3 is the structural view showing the second state-of-use.

Another array of surface-emitting lasers with high-brightness unipolar output 100 is shown as a second state-of-use in FIG. 3. The substrate is directly etched out with the epitaxial layer 14 remained to obtain a thickness reduced to less than 10 μm only; and, then, the copper layer 11 is plated.

Figure 4:
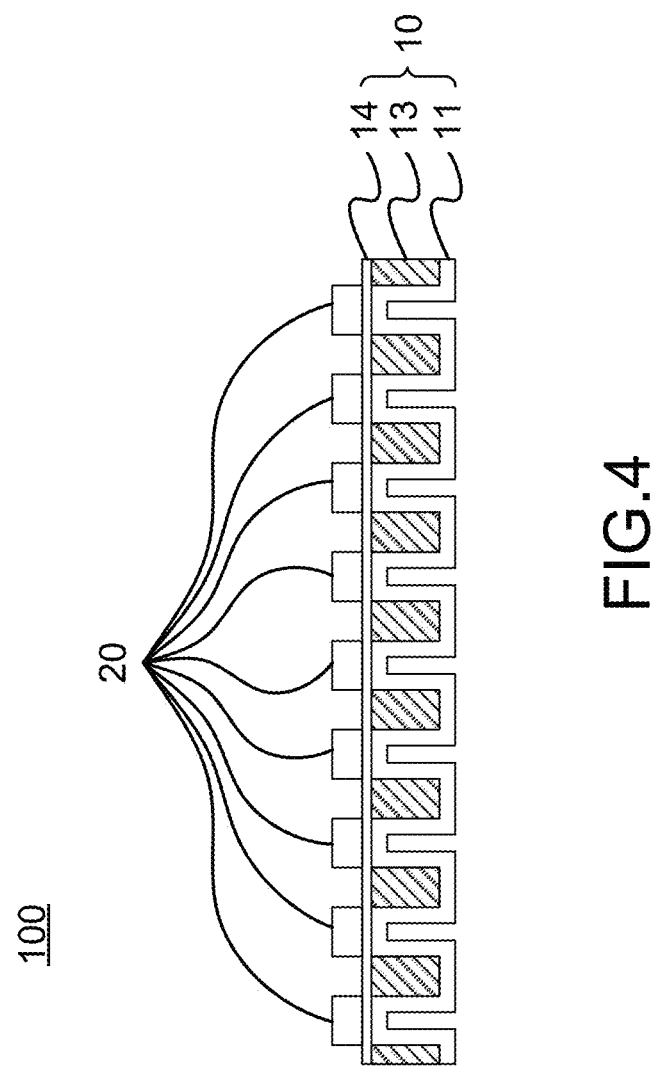
FIG. 4 is the structural view showing the third state-of-use.

Another array of surface-emitting lasers with high-brightness unipolar output 100 is shown as a third state-of-use in FIG. 4. The substrate 13 right beneath the epitaxial device unit 20 is directly etched to form a hole and, then, plated with the copper layer 11, where only the epitaxial layer 14 is kept after etching to remove the part of the substrate 13 right beneath the epitaxial device unit 2 for forming a plurality of parts of the substrate 13 interleaved between the copper layer 11 and the epitaxial layer 14.

Figure 5:
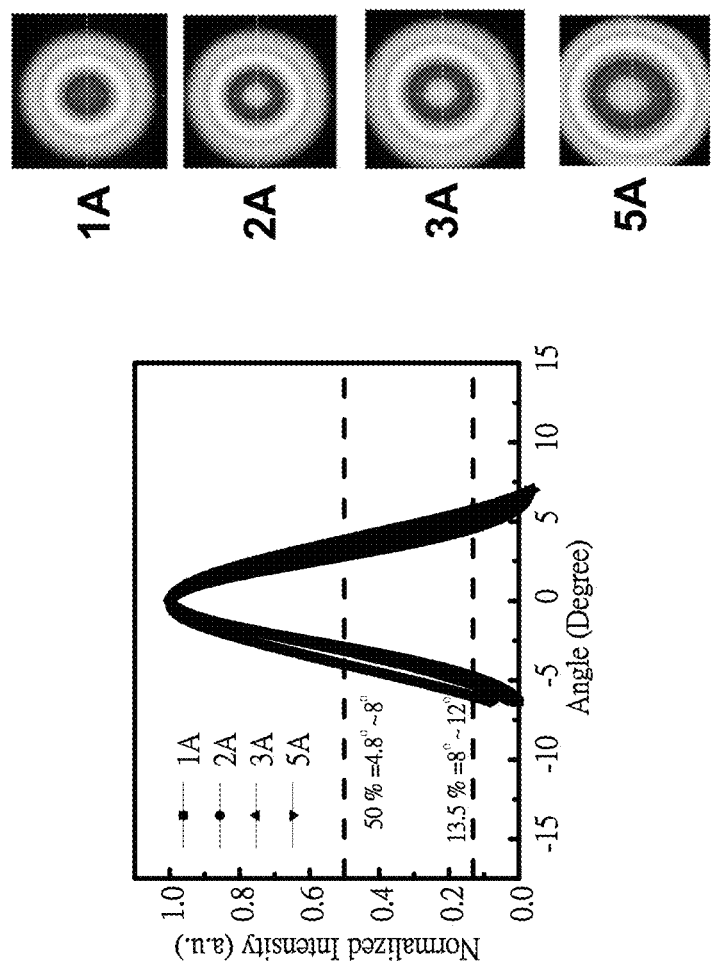
FIG. 5 is the view showing the far-field patterns of the laser outputs.
Figure 6:
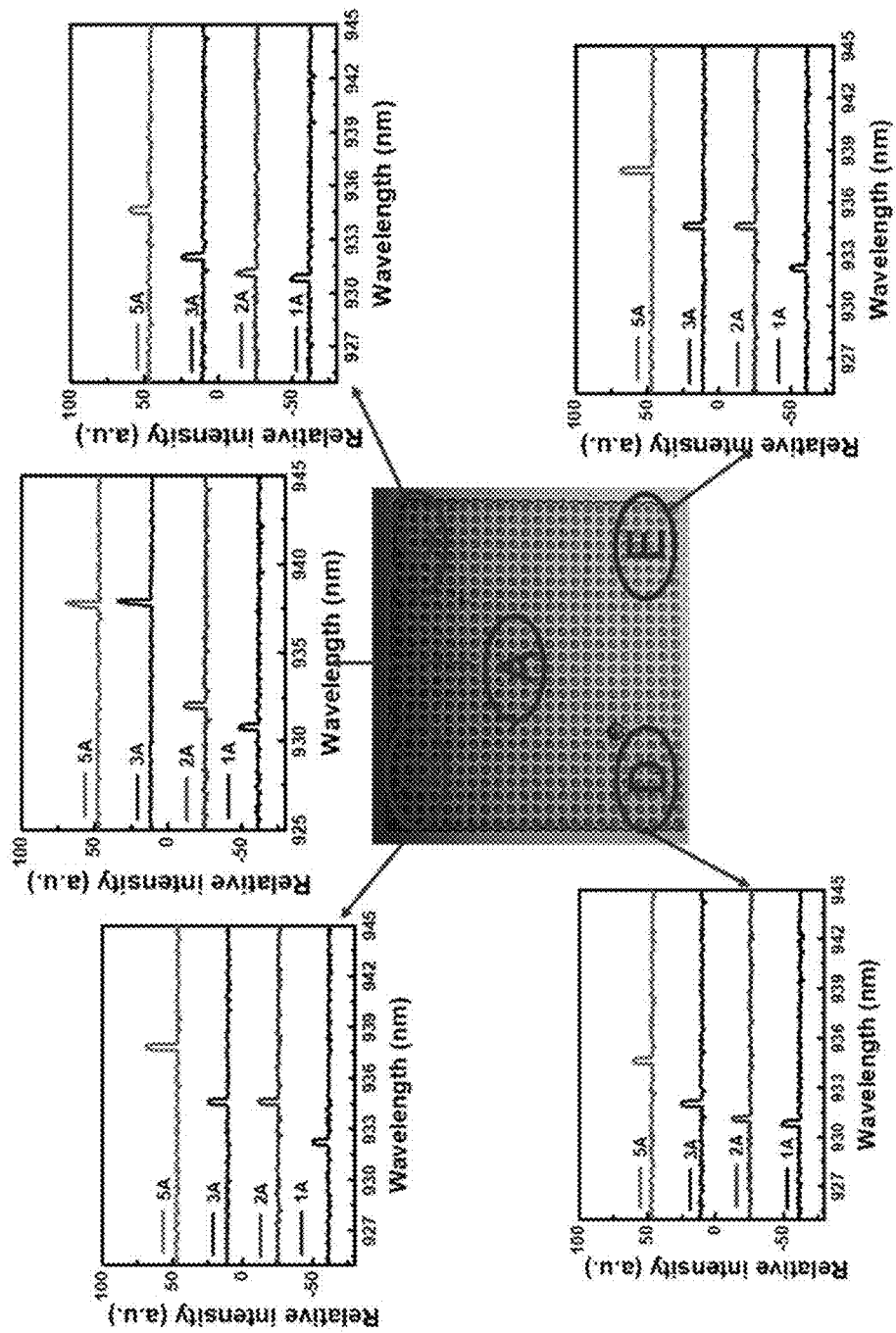
FIG. 6 is the view showing the spectral bands of the single modes.

Through the improvements in the above states-of-use, the stress-adjustment unit provides a stress adjustable and the stress can be a compression stress or a tensile stress to single-polarize the stress for enhancing selectivity of an aperture to a laser mode without sacrificing driving current while a low-current operation is achieved in a single mode, as shown in FIG. 5. The present invention can change an original intracavity optical modes into a single mode to narrow a divergent angle, as shown in FIG. 6. After the single mode is obtained, the spectral band obtains a single peak only, where images can be clearly distinguished.

Figure 7:
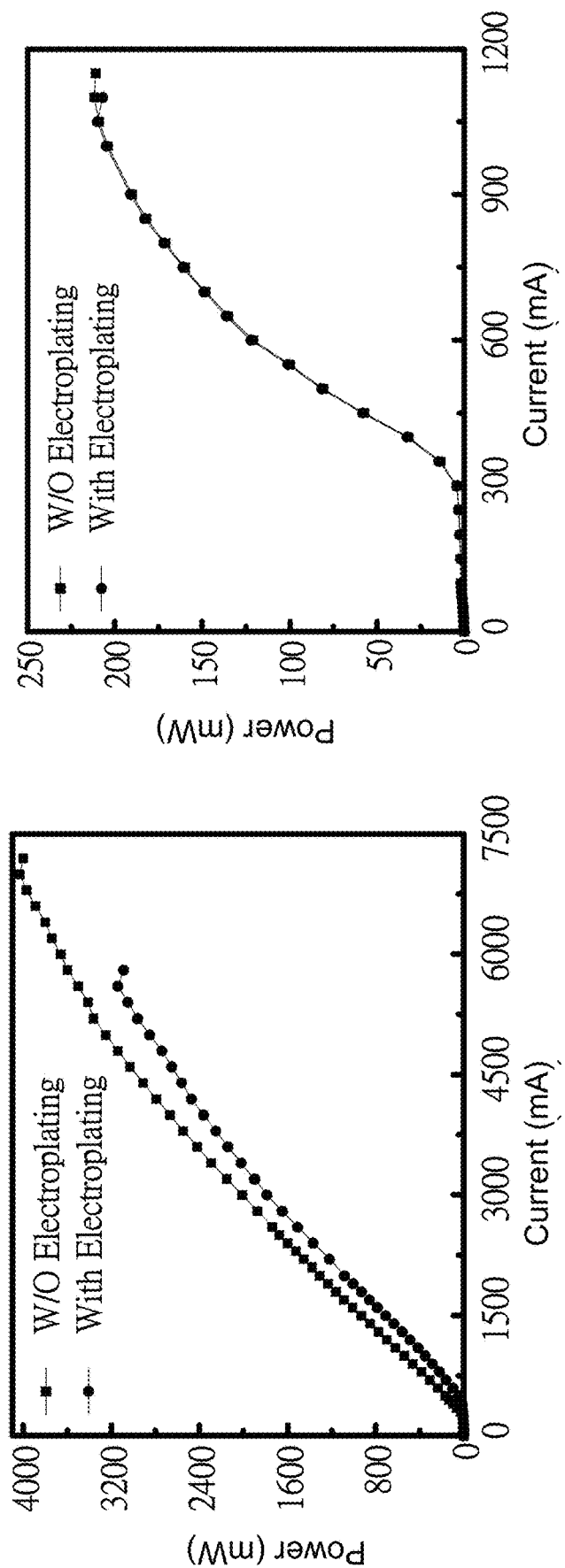
FIG. 7 is the view showing the traces of bias current vs. output power.
Figure 8:
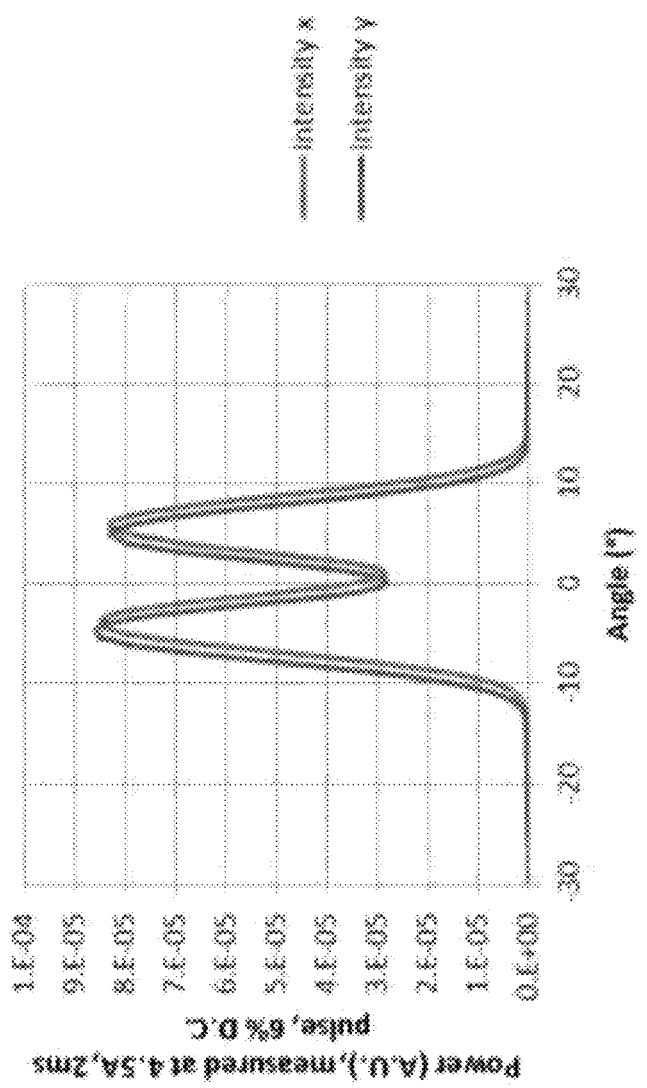
FIG. 8 is the view of the divergent angle of far field pattern of laser of the prior art.
Figure 9:
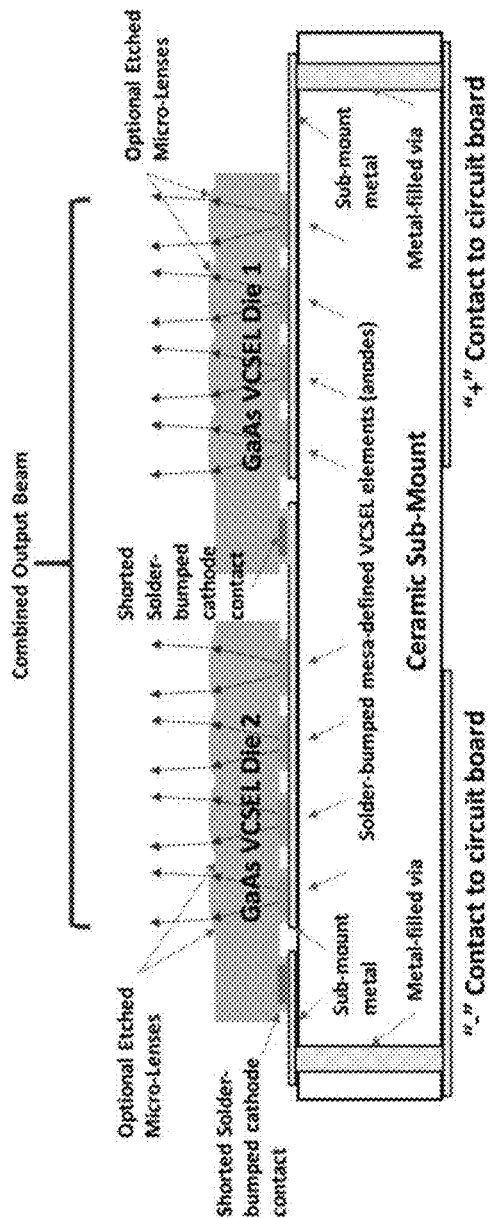
FIG. 9 is the causational view of the surface-emitting laser array of the prior art.

Besides, as can be observed from the result of comparison with FIG. 7, the present invention does not increase power-factor current, which means that the present invention achieves high-quality laser output without increasing power-factor current. An object can be scanned by a laser outputted to obtain a clear image having a high resolution. Hence, high recognition and high security are achieved to fit the use of face recognition.

In this way, a stress-adjustment unit is used to adjust stress in the present invention. The stress from a substrate is used to select an aperture unit for a laser mode. The selection of the laser mode is enhanced for the aperture unit without sacrificing driving current. Low current operation is achieved in a single mode for effectively reducing volume and further minimizing the size of the whole array to achieve the high-quality laser output. An object can be scanned by the outputted laser to obtain a clear image having a high resolution. Therefore, the present invention is applicable for face recognition with high recognition and high security achieved.

To sum up, the present invention is an array of surface-emitting lasers with high-brightness unipolar output, where single-polarization occurs with stress adjustment provided by a stress-adjustment unit to enhance the selection of laser mode of an aperture unit; driving current is not sacrificed while achieving a single-mode and low-current operation for effectively reducing volume and further minimizing the size of the whole array to output high-quality laser; an object can be scanned by the outputted laser to obtain a clear image having a high resolution; and, therefore, the present invention is applicable for face recognition achieving high recognition and high security.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. An array of surface-emitting lasers with high-brightness unipolar output, comprising
   a stress-adjustment unit,
      wherein said stress-adjustment unit comprises a copper layer and an epitaxial layer stacked on said copper layer; said stress-adjustment unit obtains a stress adjustable to single-polarize the stress for enhancing selectivity of an aperture to a laser mode driving current is not sacrificed while obtaining a single-mode and low-current operation; and
   a plurality of epitaxial device units,
      wherein each one of said epitaxial device units is stacked on said stress-adjustment unit and comprises a first distributed Bragg reflector (DBR); an active region stacked on said first DBR; and a second DBR stacked on said active region; said active region has a current-confining aperture; said current-confining aperture is deposed in a grouping at a position selected from a group consisting of a position above said active region and a position beneath said active region; said current-confining aperture obtains a current confinement zone through a method selected from a group consisting of oxidation and indentation at an annular lateral part of an aluminum (Al) composite layer; and the Al composite layer contains Al, a III element, more than 20 percent (%), where said second DBR contains a diffusion unit having a thickness reduced to 0.1~2 micrometers ($\mu m$); said diffusion unit is located around an annular area on top of said second DBR with a multilayer of different compositions selectively disordered through a doping diffusion process to obtain a single layer of single composition; and said second DBR is thus enabled to control a sum number of optical modes.

2. The array according to claim 1,
   wherein said stress is selected from a group consisting of a compressive stress and a tensile stress.

3. The array according to claim 1,
   wherein said copper layer has a thickness between 50 $\mu m$ and 1 millimeter (mm).

4. The array according to claim 1,
   wherein said epitaxial layer has a thickness smaller than 10 $\mu m \pm 20\%$.

5. The array according to claim 1,
   wherein between said copper layer and said epitaxial layer, the array further comprises a gold layer stacked on said copper layer and a substrate stacked between said gold layer and said epitaxial layer.

6. The array according to claim 5,
   wherein said substrate is of a semiconductor selected from a P-type semiconductor, an N-type semiconductor and a semi-insulating semiconductor, having a thickness of 100~200 $\mu m$.

7. The array according to claim 6,
   wherein said semi-insulating semiconductor is of gallium arsenide (GaAs).

8. The array according to claim 1,
   wherein between said copper layer and said epitaxial layer, the array further comprises a plurality of substrates interleaved with said epitaxial device units.

9. The array according to claim 1,
   wherein said first DBR is an n-type DBR (n-DBR) and said second DBR is a p-type DBR (p-DBR).

10. The array according to claim 1,
    wherein said first DBR is a p-DBR and said second DBR is an n-DBR.

11. The array according to claim 1,
    wherein said Al composite layer is partially converted to an oxide layer with center area remained unchanged and an etchant is obtained to process a selective etching to remove said oxide layer to obtain said current-confining aperture and said current confinement zone.

12. The array according to claim 1,
    wherein said current confinement zone is an annular zone having a diameter smaller than 20 $\mu m$.

13. The array according to claim 1,
    wherein said active region is a heterojunction of a compound semiconductor and an alloy thereof.

14. The array according to claim 13,
    wherein said active region is a heterojunction of indium aluminum gallium arsenide/aluminum gallium arsenide (InAlGaAs/AlGaAs).

15. The array according to claim 1,
    wherein said active region is a multiple-quantum-wells (MQWs) region of three InAlGaAs/AlGaAs interposed between said first DBR and said second DBR obtained through epitaxial growth.

16. The array according to claim 1,
    wherein a lateral side of a total of said second DBR, said active region, and a part of said first DBR is surrounded by an insulating layer.

17. The array according to claim 1,
    wherein said diffusion unit has a diameter of 5~20 $\mu m$.

18. The array according to claim 1,
wherein said diffusion unit located around said annular area on top of said second DBR is obtained through said doping diffusion process of an element selected from a group consisting of a II element, a IV element, and a VI element; and, around said center area on top of said second DBR, said multilayer of different compositions is selectively disordered to form the single layer of single composition.

19. The array according to claim 1,
wherein said diffusion unit located around said annular area on top of said second DBR is obtained through said doping diffusion process of doping an element selected from a group consisting of zinc (Zn) and magnesium (Mg); and, around said center area on top of said second DBR, said multilayer of different compositions is selectively disordered to form the single layer of single composition.

20. The array according to claim 1,
wherein said diffusion unit located around said annular area on top of said second DBR is located above said active region and is not in contact with said active region.

* * * * *